United States Patent [19]

Iwanaga et al.

[11] Patent Number: 4,963,512
[45] Date of Patent: Oct. 16, 1990

[54] METHOD FOR FORMING CONDUCTOR LAYERS AND METHOD FOR FABRICATING MULTILAYER SUBSTRATES

[75] Inventors: Shoichi Iwanaga, Yokohama; Akio Fujiwara, Fujisawa; Takayoshi Sowa, Fujisawa; Hitoshi Yokono, Fujisawa, all of Japan

[73] Assignee: Hitachi, Ltd., Tokyo, Japan

[21] Appl. No.: 281,879

[22] Filed: Dec. 8, 1988

Related U.S. Application Data

[63] Continuation of Ser. No. 29,219, Mar. 23, 1987, abandoned.

[30] Foreign Application Priority Data

Mar. 25, 1986 [JP] Japan .................................. 61-64970
May 8, 1986 [JP] Japan ................................. 61-103765

[51] Int. Cl.⁵ .......................................... H01L 21/283
[52] U.S. Cl. ..................................... 437/192; 437/230
[58] Field of Search ........................ 437/192, 203, 230

[56] References Cited

U.S. PATENT DOCUMENTS

| | | | |
|---|---|---|---|
| 3,935,635 | 2/1976 | Botzenhardt | 437/192 X |
| 3,962,004 | 6/1976 | Sonneborn | 156/11 |
| 3,993,515 | 11/1976 | Reichert | 437/192 |
| 4,122,215 | 10/1978 | Vratny | 437/194 |
| 4,184,909 | 1/1980 | Chang et al. | 156/643 |
| 4,339,305 | 7/1982 | Jones | 156/650 |
| 4,349,609 | 9/1982 | Takeda et al. | 437/203 X |
| 4,493,855 | 1/1985 | Sachdev et al. | 427/41 |
| 4,560,436 | 12/1985 | Bukhman et al. | 156/643 |
| 4,670,967 | 6/1987 | Hazuki | 437/189 |
| 4,692,349 | 9/1987 | Georgiou et al. | 437/230 |

OTHER PUBLICATIONS

Moriya et al., IEEE Electronic Components Conf. 1984, 0569-5503/84/0000-0082, pp. 82-87.

Primary Examiner—Olik Chaudhuri
Assistant Examiner—Ourmazd Ojan
Attorney, Agent, or Firm—Antonelli, Terry, Stout & Kraus

[57] ABSTRACT

A method for forming conductor layers of substrates for mounting LSIs and the like and a fabrication method of multilayer substrates are disclosed. These methods comprise steps of forming a metal underlayer having a shape similar to that of a conductor pattern on the substrate, forming an insulation layer over portions of the substrate which are not covered by the metal underlayer, and disposing a plating layer on the metal underlayer by carrying out electroless plating while using the insulation layer as the resist and thereby forming conductors. As compared with a conventional conductor layer forming method, the number of fabrication steps is reduced. And the elimination of the surface grinding step facilitates the fabrication.

10 Claims, 6 Drawing Sheets

METHOD FOR FORMING CONDUCTOR LAYERS AND METHOD FOR FABRICATING MULTILAYER SUBSTRATES

This application is a continuation of application Ser. No. 029,219, filed Mar. 23, 1987, now abandoned.

BACKGROUND OF THE INVENTION

The present invention relates to a method for forming conductor layers on substrates used to mount LSIs and the like thereon and a method for fabricating multilayer substrates.

In a conventional method for fabricating multilayer substrates, a metal underlayer 2 which can be used as a plating electrode is formed over the entire upper surface of a substrate 1 as shown in FIG. 6(a), for example. Over the upper surface of the metal underlayer 2, resist 3 is formed as grooves having desired conductor pattern shapes as shown in FIG. 6(b).

Thereafter, electroplating 4 is performed by using the above described exposed metal underlayer 2 as the electrode, and the grooves formed by the above described a resist 3 are selectively filled with conductors as shown in FIG. 6(c). At this time, through-holes which are not illustrated are also formed in the same way.

Subsequently, the resist 3 is removed to form conductors 5 as shown in FIG. 6(d) and portions of the above described metal underlayer 2 which are not adjoining the conductors 5 are removed as shown in FIG. 6(e). After an insulation layer 6 has been formed over the entire upper surface of the substrate 1 so as to wrap the above described conductors 5 therein as shown in FIG. 6(f), the upper surfaces of the conductors 5 are exposed as shown in FIG. 6(g) by using a method such as grinding and the surface of the insulation layer 6 is ground to form a flat plane. Thereafter, the above-described steps are repeated to fabricate a multilayer substrate. Such a fabrication method is described in Moriya et al. "High-density Multilayer Interconnection with Photo sensitive Polyimide Dielectric and Electroplating Conductor" in Proceedings of the 34th ECC "Electronic Component Conference", pp. 82 to 87, 1984, for example.

The above-described conventional technique thus needs the steps of selective plating, removing resists, removing the metal underlayer, forming the insulation layer over the entire surface, and grinding the surface to expose the conductor metal and make the surface of the insulation layer flat.

As a result, a large number of steps are required and it is difficult to work the substrate to produce a flat surface because of the warp of the substrate and the like. Further, unevenness of the flatly ground surface is reflected in nonuniformity of the conductor resistance.

In the case of the prior art, conductors can be disposed with high density when the conductor pattern is approximately 5 μm in thickness. When the conductor pattern having a thickness of 20 μm, for example, is to be formed with high density, the wall faces of the conductor pattern are tapered to have a shape  as a result of etching. Especially, it is difficult to dispose conductors having a high aspect ratio (where aspect ratio=the height of the conductor layer/the width thereof) with narrow conductor gaps and with high density.

SUMMARY OF THE INVENTION

An object of the present invention is to provide a method for forming conductor layers and a method for fabricating multilayer substrates in which the number of fabrication steps is largely reduced and the surface grinding step is eliminated to facilitate the fabrication.

Another object of the present invention is to provide a method for forming conductor layers and a method for fabricating multilayer substrates with high aspect ratio.

In order to achieve the above-described objects, the conductor layer forming method and the multilayer substrate fabricating method according to the present invention comprises a step of forming a metal underlayer patterned into a shape similar to a desired conductor pattern shape on a surface of the substrate whereon conductors are to be formed, a step of forming an insulation layer over portions of the substrate which are not covered by the metal underlayer, and a step of forming conductors by disposing a plating layer on the metal underlayer by using the insulation layer as a mask or resist and carrying out electroless plating.

The operation of the present invention will now be described.

When conductors are to be formed by electroless plating, the metal underlayer of the plating can undergo patterning prior to plating since the metal underlayer need not be conductive.

Accordingly, the step of removing the plating resist and the metal underlayer of plating after conducting plating becomes unnecessary. Therefore, the insulation layer worked to form grooves can serves as a plating resist, whereby the plating can be carried out.

Further, the surface grinding step becomes unnecessary by making the plating thickness agree with the thickness of the above described insulation layer.

Any kind may be used as the metal underlayer of plating so long as it is active for the electroless plating liquid. A plating layer already formed may also be used.

When some kind of metal is used as the metal underlayer of plating and immersed in a plating liquid, the insulation layer serving as the plating resist sometimes peels from the metal underlayer of plating. At this time, the plating metal underlayer is composed of two or more kinds of metal layers, and one metal used as the plating metal underlayer is disposed at the inner layer while the other metal for preventing the above-described peeling off is disposed at the upper layer, i.e., at a layer adjoining the insulation layer.

The above described other metal may be inactive with respect to the electroless plating liquid.

Subsequently, the insulation layer is formed and worked into a groove shape to expose the metal underlayer. Electroless plating is then carried out by using the insulation layer worked into a groove shape as the plating resist. In this way, the conductors can be formed while preventing the insulation layer from peeling from the metal underlayer of plating.

Further, it is possible to form a deeply worked groove having taperless perpendicular wall faces by forming grooves in the insulation layer by means of dry etching. If copper is educed into the worked grooves by electroless plating, it is possible to form taperless perpendicular copper conductors which are large in layer thickness.

The pitch between conductors is defined by the pitch between worked grooves. Since the worked groove has taperless perpendicular wall faces, the pitch between the worked grooves and hence the pitch between conductors can be made narrow. In addition, the conductor width can also be made narrow because thick conductors can be formed. As a result, high density conductors can be realized.

DETAILED DESCRIPTION OF THE PREFERRED EMBODIMENTS

At first, the first embodiment of the present invention will now be described by referring to FIG. 1(a) to FIG. 1(e).

Figure 1A:
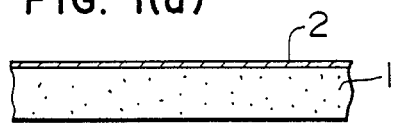
FIG. 1(a) to FIG. 1(e) show fabrication steps of a multilayer substrate according to the first embodiment of the present invention.
Figure 1B:
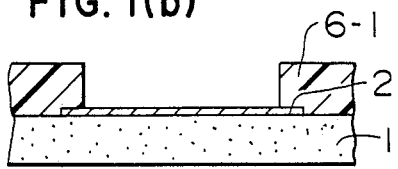

As shown in FIG. 1(a), a metal underlayer 2 of 0.3–0.4 $\mu$m thick and composed of a thin copper film is formed on a substrate 1. After the metal underlayer 2 is made to have a pattern layer by 1–40 $\mu$m more preferably, 5–10 $\mu$m in dimension larger than and similar (conforming) to a desired conductor pattern by wet etching as shown in FIG. 1(b), an insulation layer 6-1 worked to have the shape of a groove by dry etching and composed of polyimides is formed.

Thereafter, electroless copper plating is selectively carried out by using the insulation layer 6-1 worked to have the shape of a groove on the metal underlayer 2 and composed of polyimides as the plating resist. A copper plating layer 10 of 20 $\mu$m wide and 20–30 $\mu$m thick and a conductor 5 are thus formed as shown in FIG. 1(c).

Figure 1C:
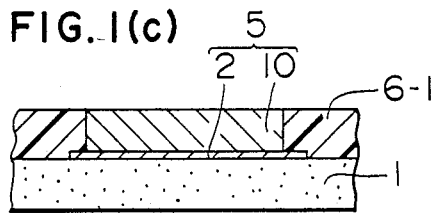
Figure 1D:
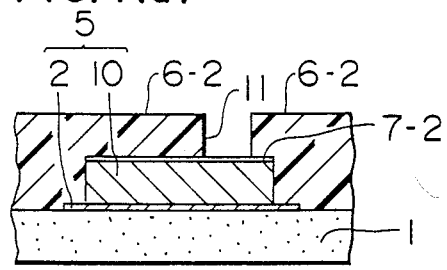

Since FIGS. 1(a) to (e) show the fabrication steps of a multilayer substrate, a step for forming through-holes each of which is 20–30 $\mu$m thick and 20–30 $\mu$m diametric ensues as shown in FIG. 1(d). If only one conductor layer is desired, however, the fabrication is completed by disposing an insulation layer 6-2 so as to cover the copper plating layer 10 after the step of FIG. 1(c). In case a polyimides insulation layer is formed as the insulation layer, for example, polyimide precursor varnish is spincoated to form a polyimide precursor varnish layer, and the polyimide precursor varnish layer is heated at 200° C. for 30 minutes and then heated at 350° C. for 30 minutes to be hardened.

In case a multilayer substrate is fabricated, a through-hole is formed as shown in FIG. 1(d) after the step of FIG. 1(c). For this purpose, a chrome thin film 7-2 is so formed as to have a shape similar to that of the above described conductor 5, namely to have a pattern wider than a desired through-hole pattern shape. And a desired through-hole pattern 11 is formed by dry etching or the like.

Figure 1E:
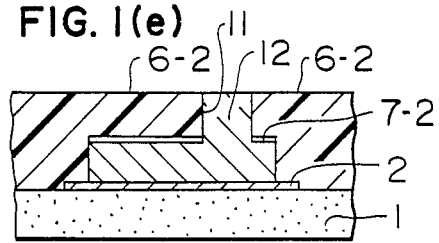

As shown in FIG. 1(e), the chrome thin film 7-2 is then selectively etched to expose the above described copper plating layer 10 by using the above described etching liquid and the above described insulation layer 6-2 as the resist. On the exposed metal underlayer 2, electroless plating is carried out upon the through-hole 11 to form a connection portion 12 by using the above-described insulation layer 6-2 as the plating resist.

A multilayer substrate can be fabricated by repeating the above-described steps.

The second embodiment of the present invention will now be described by referring to FIG. 2(a) to 2(f).

Figure 2A:
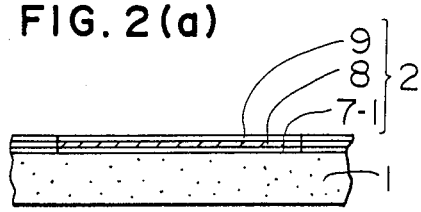
FIG. 2(a) to FIG. 2(f) show fabrication steps of a multilayer substrate according to the second embodiment of the present invention.

As shown in FIG. 2(a), a chrome thin film 7-1 which is 0.1 $\mu$m thick, a copper thin film 8 of 0.3–0.4 $\mu$m thick and a chrome thin film 9 which is 0.1 $\mu$m thick are evaporated in this order on the entire surface of the substrate 1 to form a metal underlayer 2.

Figure 2B:
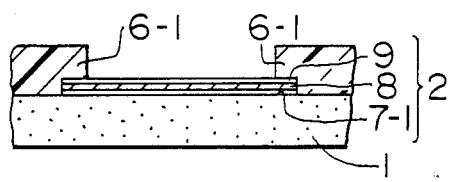

As shown in FIG. 2(b), the metal underlayer 2 is then made to have a shape similar but with a slightly larger dimension to that of a desired conductor pattern by wet etching. Thereafter, an insulation layer 6-1 worked to have the shape of a groove by dry etching and composed of polyimides is formed.

Figure 2C:
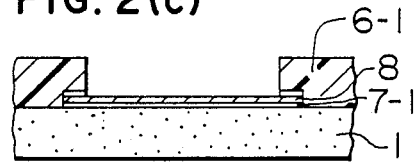

By using the insulation layer 6-1 worked to have the shape of a groove and composed of polyimides as the resist as shown in FIG. 2(c), the chrome thin film 9 which is the upper layer of the metal underlayer 2 is then selectively etched by using a potassium ferricyanide/potassium hydroxide solution.

Figure 2D:
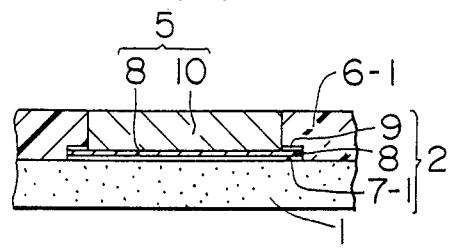
Figure 2E:
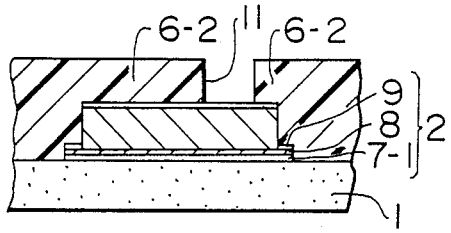
Figure 2F:
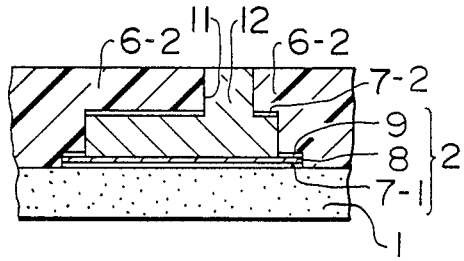

As shown in FIG. 2(d), electroless plating is selectively carried out on the above-described copper thin film 8 which is an inner layer by using the insulation layer 6-1 worked to have the shape of a groove and composed of polyimides as the plating resist. In this way, a copper plating layer 10 of 20–30 $\mu$m thick and 20 $\mu$m wide is formed to thus result in a conductor 5. Succeeding steps are the same as those described with reference to the first embodiment. In case of a single conductor layer, the fabrication is completed by forming an insulation layer 6-2 so as to cover the surface of a copper plating layer 10. In case of a multilayer substrate, it can be fabricated by forming a through-hole as shown in FIGS. 2(e) and 2(f) and thereafter repeating the above-described steps.

By using the fabrication method of a multilayer substrate according to the present invention, the number of steps can be significantly reduced as compared with the prior art and the surface grinding step can be eliminated. As a result, multilayer substrates can be fabricated easily.

Figure 5:
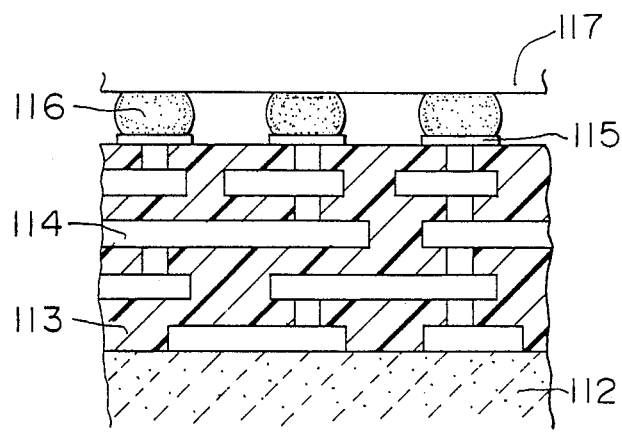
FIG. 5 is a sectional view of a multilayer substrate according to the present invention.
Figure 6A:
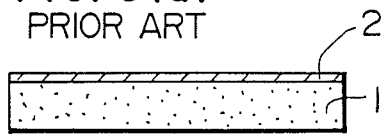
FIG. 6(a) to FIG. 6(g) show fabrication steps of a conventional multilayer substrate.
Figure 6E:
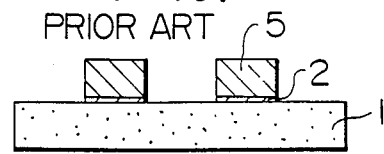
Figure 6B:
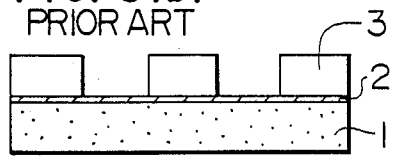
Figure 6F:
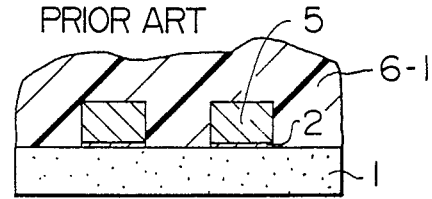
Figure 6C:
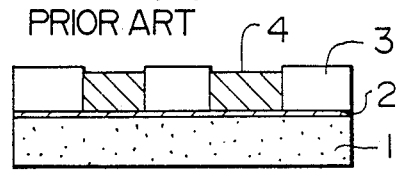
Figure 6G:
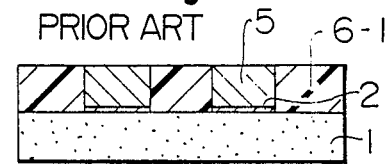
Figure 6D:
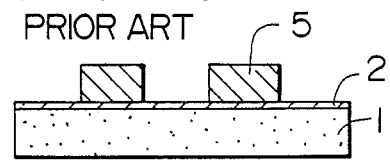

FIG. 5 shows the entire configuration of a multilayer substrate according to the present invention. On a ceramic substrate 112, polyimides layers 113 and copper layers 114 are alternately stacked to form a multilayer substrate 111. On the multilayer substrate, an LSI 117 is connected via electrodes 115 and solder 116.

Figure 3A:
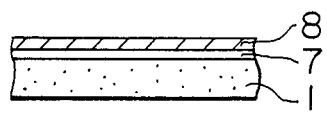
FIG. 3(a) to FIG. 3(i) show steps for forming a conductor layer according to the third embodiment of the present invention.

The third embodiment according to the present invention will now be described by referring to FIG. 3. As shown in FIG. 3(a), a chrome layer 7 having a thickness of 100 nanometer (nm) was formed on the substrate 1 by sputter deposition. On the chrome layer 7, a copper layer 8 having a thickness of 300 to 400 nanometer (nm) was formed by sputter deposition.

Figure 3B:
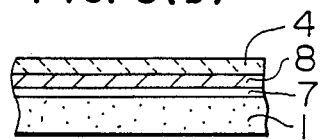

As shown in FIG. 3(b), a photo-sensitive resist (of AZ type) was then spincoated onto the copper layer 8 to form a photoresist layer not yet hardened, which was then heated at 80° to 100° C. for 30 minutes to form a photoresist layer 4.

Figure 3C:
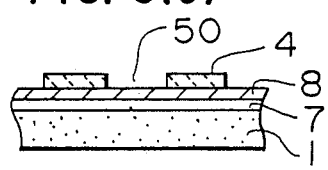
Figure 3D:
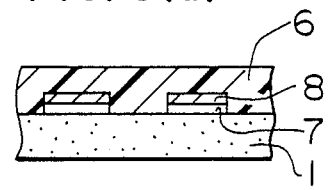

As shown in FIG. 3(c), a pattern 50 was formed in the photoresist layer 4 by the well-known photolithography technique. That is to say, the photoresist layer 4 was tightly exposed to light through a mask having a predetermined pattern thereon and developed by using a solution composed of isopropyl alcohol and toluene mixed with a ratio of 5 to 1 in volume. The photoresist layer 4 was then washed by a rinse liquid. The pattern 50 was thus formed in the photoresist layer 4. Subsequently, copper of the sample of FIG. 3(c) was selectively etched in a (copper (II) chloride)/(hydrochloric acid)/(glycerin) solution and chrome was selectively etched in a (potassium ferricyanide)/(potassium hydroxide) solution. As shown in FIG. 3(d), a plating underlayer composed of the chrome layer 7 and the copper layer 8 was thus formed.

Subsequently, polyimide precursor varnish having a viscosity of 1 to 100 poise was spincoated onto the insulation substrate 1 and the plating conductor underlayer at 2,000 to 6,000 rpm to form a polyimide precursor varnish layer as shown in FIG. 3(d). This varnish layer was heated at 200° C. for 30 minutes and at 350° C. for further 30 minutes to be hardened. By repeating the polyimide precursor varnish coating, heating and hardening several times, a polyimide insulation layer 6 having a thickness of 20–30 μm was obtained.

Figure 3E:
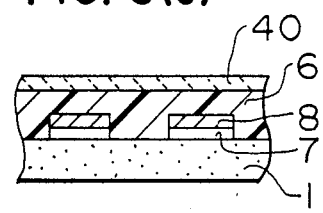

Subsequently, a P-cymene solution containing an organosilicon polymer material (n=107, average molecular weight=34,000) was spincoated at 1,000 to 2,000 rpm to form a photoresist layer which had not been hardened. The photoresist layer was heated at 80° to 100° C. for 30 minutes to form a photoresist layer 40 as shown in FIG. 3(e). The above described material had a structure as illustrated below.

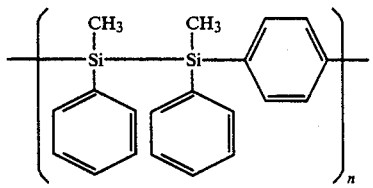

Figure 3F:
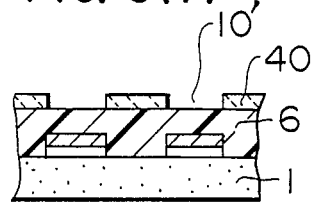

As shown in FIG. 3(f), the pattern 10' was then formed in the photoresist layer 40 by using the well-known photolithography technique. That is to say, the photoresist layer 40 was tightly exposed to light through a predetermined pattern mask, developed in a solution composed of isopropyl alcohol and toluene mixed with a ratio of 5 to 1 in volume, and washed in a rinse liquid.

Figure 3G:
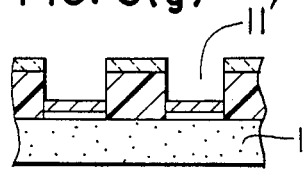

Subsequently, the sample of FIG. 3(f) was exposed to oxygen plasma. Thus, the polyimide insulation layer 6 exposed to a pattern 10' to form a conductor pattern of 20 μm wide reacted with oxygen plasma to be removed. As a result, conductor grooves 11' having perpendicular wall surfaces were formed as shown in FIG. 3(g).

Figure 3H:
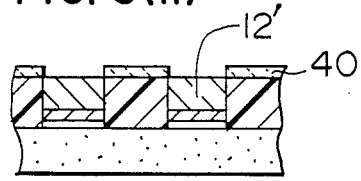

As shown in FIG. 3(h), copper layers 12' were then formed in the similar manner in the conductor grooves 11 by electroless copper plating to form a conductor layer 10 μm wide and 20–30 μm thick.

Figure 3I:
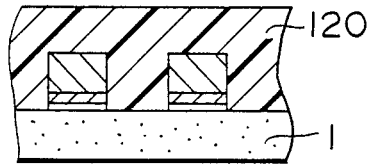

As shown in FIG. 3(i), the above-described polyimide precursor varnish was then spincoated under the above-described condition to form a polyimide precursor varnish layer. This varnish layer was heated at 200° C. for 30 minutes and at 350° C. for 30 minutes to be hardened. Thus a polyimide insulation layer 120 having a thickness of 10 μm was obtained.

As described above, the embodiment of FIG. 3 shows the fabrication steps for forming a single conductor layer. Fabrication steps for forming a multilayer substrate will now be described. After the step of FIG. 3(h), the photoresist layer 40 is removed and a chrome layer is disposed on the surface of the copper layer 12. And a polyimide insulation layer 6 is formed on the chrome layer. Thereafter, through-holes of 20–30 μm diametric and 20–30 μm thick are formed in the copper layer by dry etching in the same manner as FIGS. 1 or 2. The copper layer 12 is then exposed by an etching liquid and electroless plating is carried out onto the metal underlayer. Thereby, a conductor is formed in the through-hole. The multilayer substrate can be fabricated by repeating the above-described steps.

Figure 4A:
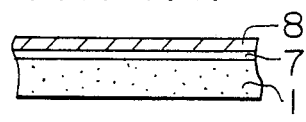
FIG. 4(a) to FIG. 4(j) show steps for forming a conductor layer according to the fourth embodiment of the present invention.

The fourth embodiment of the present invention will now be described by referring to FIG. 4. As shown in FIG. 4(a), a chrome layer 7 having a thickness of 100 nanometer (nm) was formed on the substrate 1 by sputter deposition. On the chrome layer 7, a copper layer 8 having a thickness of 300 to 400 nanometer (nm) was formed by sputter deposition.

Figure 4B:
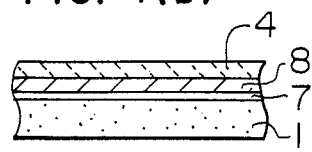

As shown in FIG. 4(b), a photo-sensitive resist of AZ type was then spincoated on the copper layer 8 to form a photoresist layer which had not been hardened yet. The photoresist layer was heated at 80° to 100° C. for 30 minutes to form a photoresist layer 4.

Figure 4C:
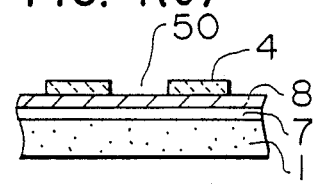

Subsequently, a pattern 50 was then formed in the resist layer 4 by using the well-known lithography technique as shown in FIG. 4(c).

Subsequently, the exposed copper of the sample of FIG. 4(c) was selectively etched in a (copper (II) chloride)/(hydrochloric acid)/(glycerin) solution. Further, the exposed chrome was selectively etched in a (potassium ferricyanide)/(potassium hydroxide) solution. Thus, a plating underlayer composed of the chrome layer 7 and the copper layer 8 was formed.

Figure 4D:
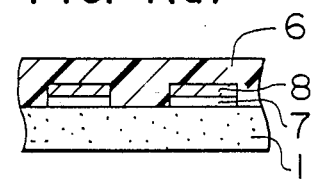

As shown in FIG. 4(d), polyimide precursor varnish having a viscosity of 1 to 100 poise was spincoated onto the alumina substrate 1 and the plating conductor underlayer at 2,000 to 6,000 rpm to form a polyimide precursor varnish layer as shown in FIG. 4(d). This varnish layer was heated at 200° C. for 30 minutes and at 350° C. for further 30 minutes to be hardened. By repeating the polyimide precursor varnish coating, heating and hardening several times, a polyimide insulation layer 6 having a thickness of 20 μm was obtained.

Figure 4E:
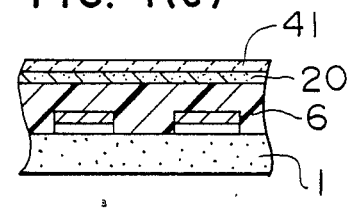

As shown in FIG. 4(e), an $SiO_2$ layer 20 having a thickness of 100 nanometer (nm) was then formed on the insulation layer. A photo-sensitive resist of AZ type was spincoated onto the $SiO_2$ layer 20 to form a photoresist layer which had not been hardened yet. The photoresist layer was heated at 80° to 100° C. for 30 minutes to form a photoresist layer 41.

Figure 4F:
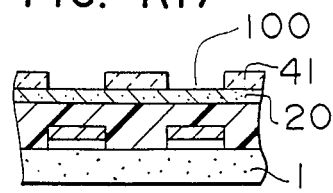

Subsequently, a pattern 100 was formed in the photoresist layer 41 by using the well-known lithography technique as shown in FIG. 4(f). That is to say, the photoresist layer was tightly exposed to light through a predetermined pattern mask, developed in a solution composed of isopropyl alcohol and toluene mixed with a ratio of 5 to 1 in volume, and washed in a rinse liquid.

Subsequently, the sample of FIG. 4(f) was immersed in fluoric acid. And the $SiO_2$ layer 20 was selectively etched to form a pattern 101 used for oxygen dry etching.

Figure 4G:
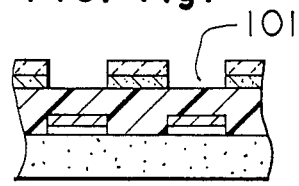
Figure 4H:
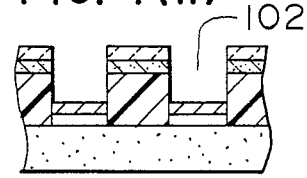

Subsequently, the sample of FIG. 4(g) was exposed to oxygen plasma. Thus, the polyimide insulation layer 6 exposed to the pattern 101 was removed by oxygen plasma. As a result, conductor grooves 102 having perpendicular wall faces were formed as shown in FIG. 4(h).

Figure 4I:
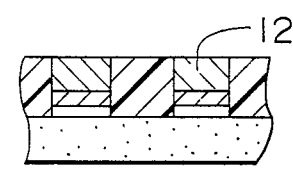

As shown in FIG. 4(i), copper layers 12 were then formed in the conductor grooves by electroless plating.

Figure 4J:
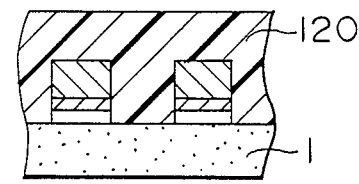

As shown in FIG. 4(j), the above described polyimide precursor varnish was then spincoated onto the copper layers 12 to form a polyimide precursor varnish layer. This varnish layer was heated at 200° C. for 30 minutes and at 350° C. for 30 minutes to be hardened. Thus a polyimide insulation layer 120 having a thickness of 10 μm was obtained.

The embodiment of FIG. 4 shows the steps for forming a single conductor layer.

In case a multilayer substrate is to be fabricated, a chrome layer and a copper layer are disposed on the surface of the copper layer 12 after the step of FIG. 4(i), and a polyimide insulation layer 6 is formed over them. Succeeding steps are similar to those described for the third embodiment and are omitted.

By using the third or fourth embodiment, conductors having a high aspect ratio and a large thickness can be formed with a narrow pitch. Accordingly, a high density substrate can be obtained. Even if the conductor width is reduced to raise the density, the conductor resistance does not increase because the conductor thickness can be increased.

As heretofore described, the present invention significantly reduces the number of steps as compared with the prior art and makes the surface grinding unnecessary. As a result, multilayer substrates can be easily fabricated.

We claim:

1. A method of forming a conductor layer on a substrate comprising, in sequence, the steps of:
   previously forming a metal underlayer on a surface of a substrate designated to have a conductor formed thereon, said metal underlayer comprising an upper layer of chromium and said metal underlayer being patterned to have a pattern slightly larger than and similar to a desired conductor pattern;
   forming a polyimide insulation layer over said substrate surface, said polyimide insulation layer being patterned by dry etching to form a groove and to expose a portion of said metal underlayer on which said desired conductor pattern is to be formed;
   removing the upper layer of chromium with wet etching after formation of the groove to expose a metal layer of the underlayer active to electroless plating; and
   disposing a plating layer in the groove and on the exposed portion of said metal underlayer by carrying out electroless plating while applying said polyimide insulation layer as a mask and thereby forming a conductor layer with a high aspect ratio ranging from 0.6 to 1.5.

2. A method for forming a conductor layer according to claim 1, wherein said insulation layer is formed on the periphery of said metal underlayer.

3. A method for forming a conductor layer according to claim 14, wherein said metal underlayer comprises a chromium layer, a copper layer and a chromium layer in a sandwich structure.

4. A method for forming a conductor layer according to claim 1, wherein a photoresist layer formed by spin-coating an organosilicon polymer material and heating it is used as a mask for said dry etching.

5. A method for forming a conductor layer according to claim 1, wherein an $SiO_2$ layer and a photoresist layer on said insulation layer are applied as a mask for said dry etching.

6. A fabrication method of multilayer conductor patterns according to claim 5, wherein said first insulation layer is formed on the periphery of said metal underlayer.

7. A fabrication method of multilayered conductor patterns comprising the steps of:
   (a) forming a metal underlayer on a surface of a substrate destined to have a conductor formed thereon, said metal underlayer comprising an upper layer of chromium and said metal underlayer being patterned to form a desired conductor pattern, with a slightly larger dimension than said conductor pattern;
   (b) forming a first polyimide insulation layer over portions of said substrate and said metal underlayer;
   (c) providing a conductor pattern in said first polyimide insulation layer by dry etching to from a groove and to expose a portion of said metal underlayer;
   (d) removing the upper layer of chromium with wet etching after formation of the groove to expose a metal layer of the underlayer active to electroless plating;
   (e) disposing a plating layer in the groove and on the exposed portion of the metal underlayer by conducting electroless plating while applying the first polyimide insulation layer as a mask and thereby forming a patterned conductor having a high aspect ratio ranging from 0.6 to 1.5;
   (f) forming a chromium layer on said patterned conductor;
   (g) forming a second polyimide insulation layer on said patterned conductor to form a through-hole on said conductor;
   (h) removing the chromium layer from the patterned conductor by wet etching;
   (i) filling a plating layer in said through-hole by carrying out electroless plating using said second polyimide insulation layer as a mask; and
   (j) forming multilayered conductor patterns comprising conductors and insulation layers alternately laminated by repeating said steps (a) to (j).

8. A fabrication method of multilayer conductor patterns according to claim 7, wherein said metal underlayer comprises a chromium layer, a copper layer and a chromium layer.

9. A fabrication method of multilayer conductor patterns according to claim 7, wherein a photoresist layer formed by spin-coating an organosilicon polymer material and heating it is applied as a resist mask for said dry etching.

10. A fabrication method of multilayer conductor patterns according to claim 7, wherein an $SiO_2$ layer and a photoresist layer on said first insulation layer are applied as a mask for said dry etching.

* * * * *